United States Patent
Wolf et al.

(10) Patent No.: US 7,155,469 B2
(45) Date of Patent: Dec. 26, 2006

(54) METHOD OF CORRECTING PHYSICAL IMPAIRMENTS OF A PROGRAMMABLE FILTER

(75) Inventors: Guy Wolf, Petach Tikva (IL); Dimitry Petrov, Beit-Shemesh (IL)

(73) Assignee: Intel Corporation, Santa Clara, CA (US)

(*) Notice: Subject to any disclaimer, the term of this patent is extended or adjusted under 35 U.S.C. 154(b) by 697 days.

(21) Appl. No.: 10/331,607

(22) Filed: Dec. 31, 2002

(65) Prior Publication Data
US 2004/0128333 A1 Jul. 1, 2004

(51) Int. Cl.
*G06F 17/10* (2006.01)
*G06G 7/02* (2006.01)

(52) U.S. Cl. ...................... 708/322; 708/819
(58) Field of Classification Search ................ 708/322, 708/316
See application file for complete search history.

(56) References Cited

U.S. PATENT DOCUMENTS

| | | | | |
|---|---|---|---|---|
| 4,386,430 A | * | 5/1983 | Treiber | 375/232 |
| 4,403,298 A | * | 9/1983 | May, Jr. | 708/322 |
| 4,417,317 A | * | 11/1983 | White et al. | 708/819 |
| 4,775,984 A | * | 10/1988 | Jaffre et al. | 375/288 |
| 5,168,459 A | * | 12/1992 | Hiller | 708/322 |
| 5,710,793 A | * | 1/1998 | Greenberg | 375/232 |
| 5,734,598 A | * | 3/1998 | Abbott et al. | 708/322 |
| 5,991,339 A | * | 11/1999 | Bazes et al. | 375/232 |
| 2002/0150174 A1 | | 10/2002 | Spiegel et al. | |

FOREIGN PATENT DOCUMENTS

IL 133451 12/1999

* cited by examiner

*Primary Examiner*—Tan V. Mai
(74) *Attorney, Agent, or Firm*—Pearl Cohen Zedek Latzer, LLP

(57) ABSTRACT

In some embodiments of the present invention, a known input signal is fed to a programmable filter. The output of the filter is compared to a calculated desired output for the same or similar input, and the difference between the outputs may be used to define correction values. The correction values are used then to correct an output signal.

13 Claims, 2 Drawing Sheets

METHOD OF CORRECTING PHYSICAL IMPAIRMENTS OF A PROGRAMMABLE FILTER

BACKGROUND OF THE INVENTION

A programmable filter (also known as a 'convolver') may perform convolution between a signal and an impulse response of that programmable filter. A desired impulse response of a programmable filter is one that performs a desired convolution. It is possible to generate a desired impulse response, and to perform the mathematical operations involved in convolution (such as integration, multiplication, time-shift etc.) with physical operators (integrators, multipliers etc.).

Some conventional programmable filters may comprise two or more branches each having substantially the same impulse response. The branches may involve physical operators that perform similar operations with a delay in time between the branches.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
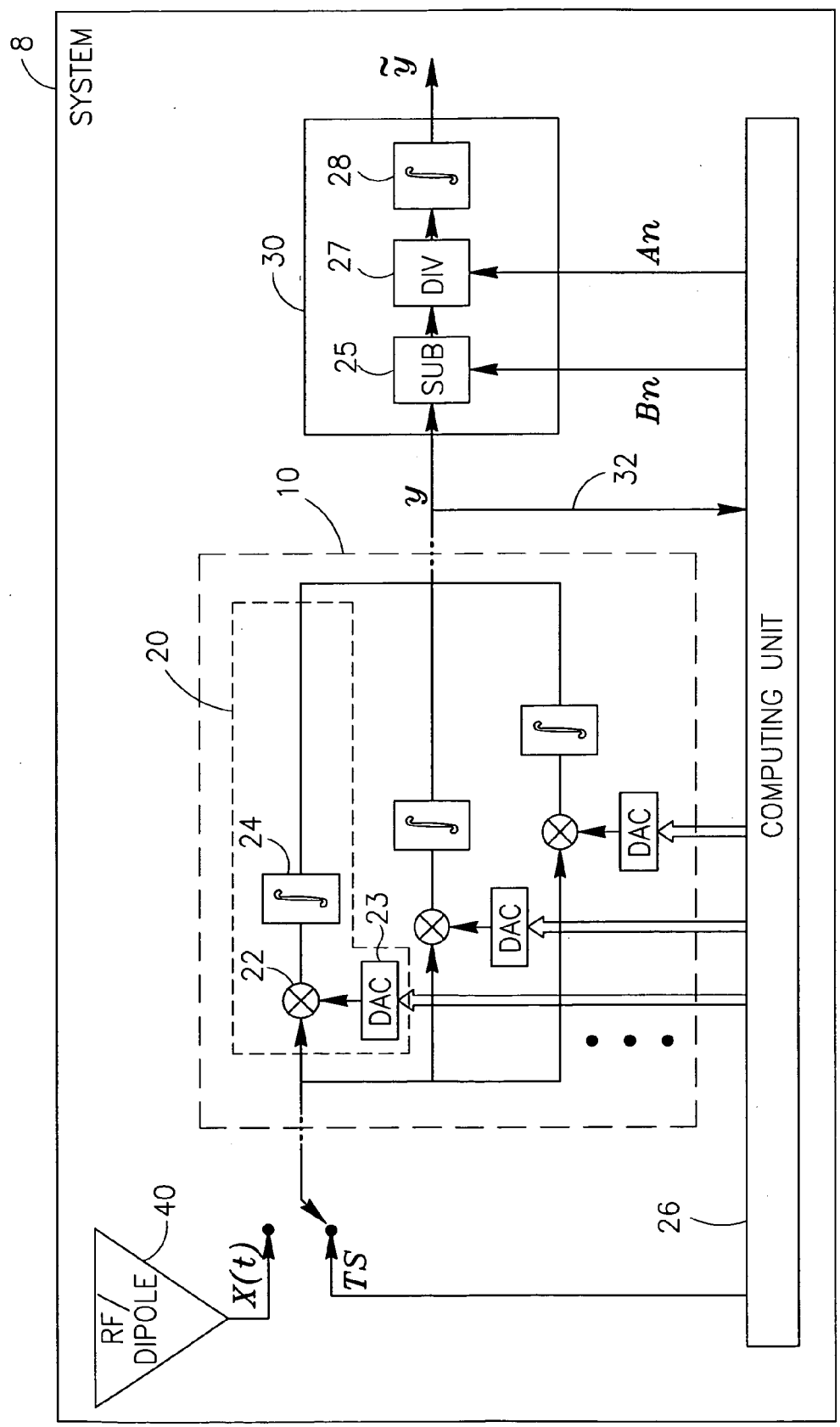
FIG. 1 is a simplified block-diagram illustration of a part of system comprising programmable filter constructed and working according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

It should be understood that the present invention may be used in a variety of applications. Although the scope of the present invention is not limited in this respect, the circuit disclosed herein may be used in many apparatuses such as in the receivers of a radio system. Radio systems intended to be included within the scope of the present invention include, by way of example only, cellular radiotelephone communication systems, two-way radio communication systems, one-way pagers, two-way pagers, personal communication systems (PCS), personal digital assistants (PDA), and the like.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operation herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROM's), compact disc read-only memories (CD-ROM's), random access memories (RAM's), electrically programmable read-only memories (EPROM's), electrically erasable and programmable read only memories (EEPROM's), FLASH memory, magnetic or optical cards, or any other type of media suitable for storing electronic instructions and capable of being coupled to a computer system bus.

In a convolver there may be inherent variations in the properties of the physical operators of the branches. These inherent variations may cause the actual impulse response of the convolver to be different than the desired impulse response, thus causing the actual output of the programmable filter to be less accurate than desired.

Reference is made now to FIG. 1, which is a simplified block-diagram illustration of a part of system 8 comprising programmable filter 10 constructed and working according to some embodiments of the present invention. System 8 may comprise also an RF antenna 40, a correction unit 30 and a computing unit 26. Antenna 40 may be of any desired kind such as, but not limited to, dipole, Yagi, multi-pole. Programmable filter 10 may comprise N substantially similar branches 20. Although the scope of the present invention is not limited in this respect, as an example, branch 20 may comprise a multiplier 22 and an integrator 24. The two input terminals of multiplier 22 may receive an input signal in one of them and convolution values, as provided by, for example, computing unit 26 and after being converted from digital form to analog form by a DAC unit 23. The input of programmable filter 10 may selectably be fed either with an input signal X(t) or with a training signal (TS). Programmable filter 10 may be in active communication with computing unit 26 via a suitable interface (not shown).

Figure 2:
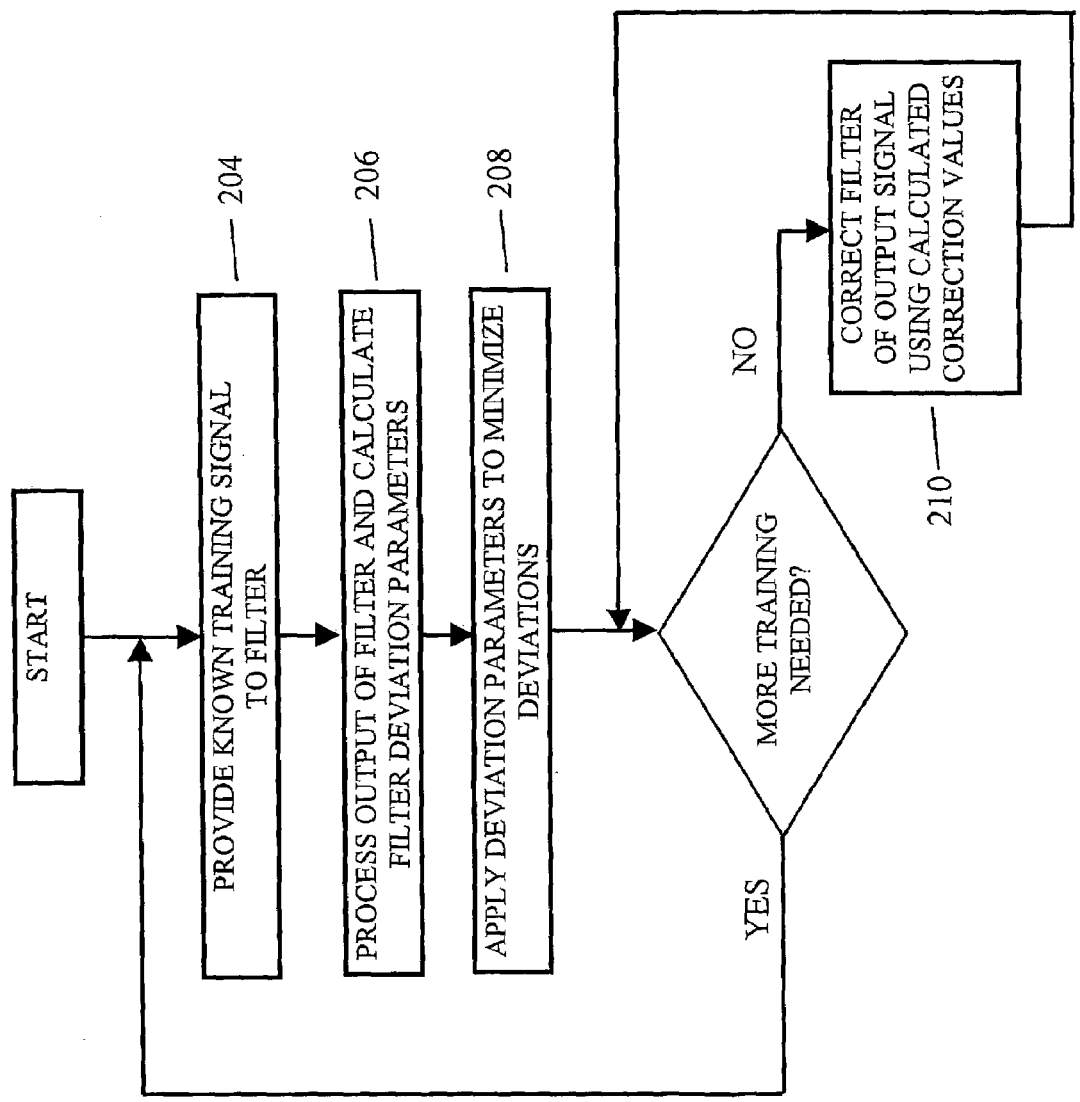
FIG. 2 is a flowchart diagram illustrating the operation of a programmable filter constructed and working according to some embodiments of the present invention.

Reference is made now also to FIG. 2, a flowchart diagram illustrating the operation of a programmable filter constructed and working according to an exemplary embodiment of the present invention. In order to identify dissimilarities between the N branches in programmable filter 10, which may cause a difference between a desired output y(desired) and the actual output y, a training signal TS may be fed to the input terminal of programmable filter 10 (block 204), at any time when input signal X(t) is disconnected from it. TS may be a pre-determined signal of any desired nature. TS may be produced by, for example, but not limited to, computing unit 26. The actual response of programmable filter 10 to TS is $y^{TS}$. Actual output $y^{TS}$ may be compared to a corresponding desired output $y(desired)^{TS}$, for example an output of a programmable filter having no dissimilarities between its branches, resulting from TS. The desired output y(desired)$^{TS}$ may be computed in advance, for example, but not limited to, by computing unit 26. Such a comparison may be used to compute the dissimilarities between the N branches of programmable filter 10.

For practical purposes it may be sufficient to calculate only the first order of the deviations from a desired output of programmable filter 10, e.g. deviations in gain and offset, of each branch. Under these provisions, any branch may be simplified, to be represented by a multiplier and an integrator having filtering deviations that arise from dissimilarities in gain and offset. The gain of multiplier 22 of branch n, $1 \leq n \leq N$, is denoted $a1_n$, and the gain of integrator 24 of branch n is denoted $a2_n$. Similarly, the offset of multiplier 22 in branch n is denoted $b1_n$ and the offset of integrator 24 in branch n is denoted $b2_n$. Thus, an output signal $y_n$ of a single branch n may be written as:

$$y_n(t) = a2_n \cdot \left( \int (a1_n \cdot X(t) + b1_n) dt \right) + b2_n \quad (1)$$
$$= a2_n \cdot a1_n \cdot \int X(t) dt + a2_n \cdot b1_n \cdot T + b2_n$$

where t is the time variable and T is the integration interval. By applying a direct current (DC) level $\lambda$ as the training signal TS it can be shown that:

$$y_n(\lambda) = a2_n \cdot a1_n \cdot \lambda \cdot T + a2_n \cdot b1_n \cdot T + b2_n = A_n \cdot T + B_n \quad (2)$$

In equation (2) $A_n$ and $B_n$ represent the deviation of the gain and offset respectively of branch n in programmable filter 10.

Output y is a combination of the outputs y(n) of all branches n. Output y may be measured, as indicated by arrow 32, by computing unit 26 (block 206). Portions of output y corresponding to a specific branch n in programmable filter 10 may be identified in several ways, such as but not limited to, synchronizing readings of y with the convolution operation of programmable filter 10. Additionally, gain and offset deviations $A_n$ and $B_n$ may be calculated by computing unit 26 (block 206). Once calculated for each branch, $A_n$ and $B_n$ may be used for correction of the actual output y of programmable filter 10 (block 208), so as to cancel and\or at least reduce the effect of dissimilarity of physical elements between branches, due to physical impairments. The corrected output signal ỹ may then be given by equation 3:

$$\tilde{y} = \sum_{n=1}^{N} \frac{y_n - B_n}{A_n} \quad (3)$$

$A_n$ and $B_n$, being the correction values for the gain and offset respectively of branch n in programmable filter 10, form a correction vector for $1 \leq n \leq N$ of the size $2 \times N$ in this example.

The operations of equation 3 involved in applying correction values to $y_n$ (block 210) may be carried out by a correction unit 30, which may comprise a subtraction unit 25, a division unit 27 and an integration unit 28. Correction values $A_n$ and $B_n$ may be provided respectively to division unit 27 and to subtraction unit 25 by computing unit 26. It would be apparent to a person skilled in the art that correction unit 30 may be implemented in hardware, in software or in any suitable combination thereof. It would also be apparent that correction unit 30 may comprise any desired operators, to apply the correction values as calculated earlier.

Once correction values have been calculated, training signal TS may be disconnected from the input of programmable filter 10, and input signal X(t) may be fed therein (block 210). The output y of programmable filter 10 may then be fed to the input of correction unit 30 (block 210). Correction values may be fed to subtraction unit 25 and to division unit 27 by computing unit 26.

It is possible to use the correction values to correct the output of programmable filter 10 as long as desired. If the dissimilarities have changed (due to, for example, a change in the working conditions, a change in ambient temperature, etc.) input signal X(t) may be disconnected from the input of programmable filter 10, and the process above may be re-applied. For example, but not limited to, calculation of the correction values may first be carried out during power-up period of programmable filter 10.

It would be apparent to a person skilled in the art that the method for correcting dissimilarities in branches of a programmable filter described above is just an example. The same inventive solution may be used in many other ways, as long as programmable filter 10 may be fed with known signal TS, and the resulting sampled and filtered output may be measured and compared with the desired output TS.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of compensating for an impairment of a programmable filter, the method comprising:
    determining correction values based on a first output signal from said programmable filter, and
    providing said correction values to correct a second, subsequent, output signal from said programmable filter,
    wherein determining comprises receiving said first output signal from said programmable filter in response to a predetermined input signal,
    and wherein the predetermined input signal includes at least a direct current voltage.

2. The method of claim 1, further comprising, during a power-up period of said programmable filter, applying said predetermined input signal to said programmable filter.

3. The method of claim 1, further comprising providing said correction values to compensate at least partially for deviations between branches of said programmable filter.

4. The method of claim 3, wherein said deviations comprise deviations in gain and offset of said branches.

5. A method of compensating for an impairment of a programmable filter, the method comprising:
    calculating correction values for said programmable filter from a comparison of a response of said programmable filter to a known signal with a desired response to said known input signal; and
    using said correction values to compensate at least partially for impairments in said filter by correcting an output of said filter, wherein said known signal includes at least a direct current voltage, and wherein said impairments comprise deviations between branches of said programmable filter.

6. The method of claim 5, wherein said deviations comprise deviations in gain and offset of said branches.

7. The method of claim 5, further comprising:
determining whether said correction values providing insufficient compensation for said impairments and whether to calculate new correction values.

8. An apparatus comprising:
a programmable filter having an input terminal and an output terminal;
a correction unit; and
a computing unit operably coupled to said output terminal and to said correction unit, to provide a predetermined signal to said input terminal alternatively to an input signal,
wherein said correction unit is responsive to correction values providable by said computing unit.

9. The apparatus of claim 8, wherein said correction values are computable responsive to said output signal, and wherein said output signal is received in response to said predetermined signal.

10. An article for compensating for an impairment of a programmable filter, the article comprising a storage medium having stored therein instructions that, when executed by a computing unit, result in:
determining correction values based on a first output signal from said programmable filter;
providing said correction values to a correction unit to correct a second, subsequent, output signal from said programmable filter; and
determining whether new correction values need to be calculated.

11. The article of claim 10, wherein the instructions further result in:
determining whether said new correction values are sufficiently calculated.

12. A system comprising:
an apparatus comprising:
a dipole antenna to send and receive wireless communication signals;
a programmable filter having an input terminal and an output terminal;
a correction unit; and
a computing unit operably coupled to said output terminal and to said correction unit, to provide a predetermined signal to said input terminal alternatively to an input signal,
wherein the dipole antenna is in communication with said input terminal of said programmable filter,
and wherein said correction unit is responsive to correction values providable by said computing unit.

13. The system of claim 12, wherein said correction values are computable responsive to said output signal, and wherein said output signal is received in response to said predetermined signal.

* * * * *